United States Patent [19]
Honma et al.

[11] Patent Number: 5,324,967
[45] Date of Patent: Jun. 28, 1994

[54] TURN OFF TYPE SEMICONDUCTOR DEVICE, METHOD OF PRODUCING THE SAME AND THE POWER CONVERSION APPARATUS EMPLOYING THE SAME

[75] Inventors: Hideo Honma; Yukimasa Satou, both of Hitachi; Susumu Murakami, Katsuta; Tsutomu Yatsuo, Hitachi; Isamu Sanpei, Kitaibaraki; Kenji Yagishita, Hitachiota, all of Japan

[73] Assignee: Hitachi, Ltd., Tokyo, Japan

[21] Appl. No.: 742,833

[22] Filed: Aug. 8, 1991

[30] Foreign Application Priority Data

Sep. 19, 1990 [JP] Japan .................. 2-246974

[51] Int. Cl.$^5$ .......................................... H01L 29/74
[52] U.S. Cl. ........................... 257/147; 257/149; 257/153; 257/754; 257/757
[58] Field of Search ............ 257/138, 137, 147, 149, 257/153, 754, 757

[56] References Cited

U.S. PATENT DOCUMENTS

| | | | |
|---|---|---|---|
| 4,586,968 | 5/1986 | Coello-Vera | 257/754 |
| 4,729,969 | 3/1988 | Suda et al. | 257/754 |
| 4,829,348 | 5/1989 | Broich et al. | 257/153 |
| 4,962,414 | 10/1990 | Liou et al. | 257/757 |
| 5,010,384 | 4/1991 | Haruki et al. | 257/147 |

FOREIGN PATENT DOCUMENTS

| | | | |
|---|---|---|---|
| 0014098 | 8/1980 | European Pat. Off. | 257/153 |
| 0064561 | 11/1982 | European Pat. Off. | |
| 0178387 | 4/1986 | European Pat. Off. | |
| 0317915 | 5/1989 | European Pat. Off. | |
| 57-39575 | 3/1982 | Japan | 257/147 |
| 62-147769 | 12/1985 | Japan | |
| 61-100966 | 5/1986 | Japan | |

OTHER PUBLICATIONS

Roggwiller, P., et al. "A Highly Interdigitated GTO Power Switch..." IEDM 1984, 439-41.

Primary Examiner—Sara W. Crane
Attorney, Agent, or Firm—Antonelli, Terry, Stout & Kraus

[57] ABSTRACT

In a turn off type semiconductor device, an n-type emitter layer is divided into a plurality of elements by trenches. A silicide layer of a high melting point metal is provided on a p-type layer adjacent to the individual elements of the n-type emitter layer on a bottom of each of the trenches. A gate electrode is provided on the associated silicide layer so as to surround the plurality of elements of the n-type emitter layer obtained by the division of the emitter layer. An insulator is filled in each of the trenches dividing the n-type emitter layer surrounded by the gate electrode. A cathode electrode is provided on both the insulators and the n-type emitter layer.

21 Claims, 10 Drawing Sheets

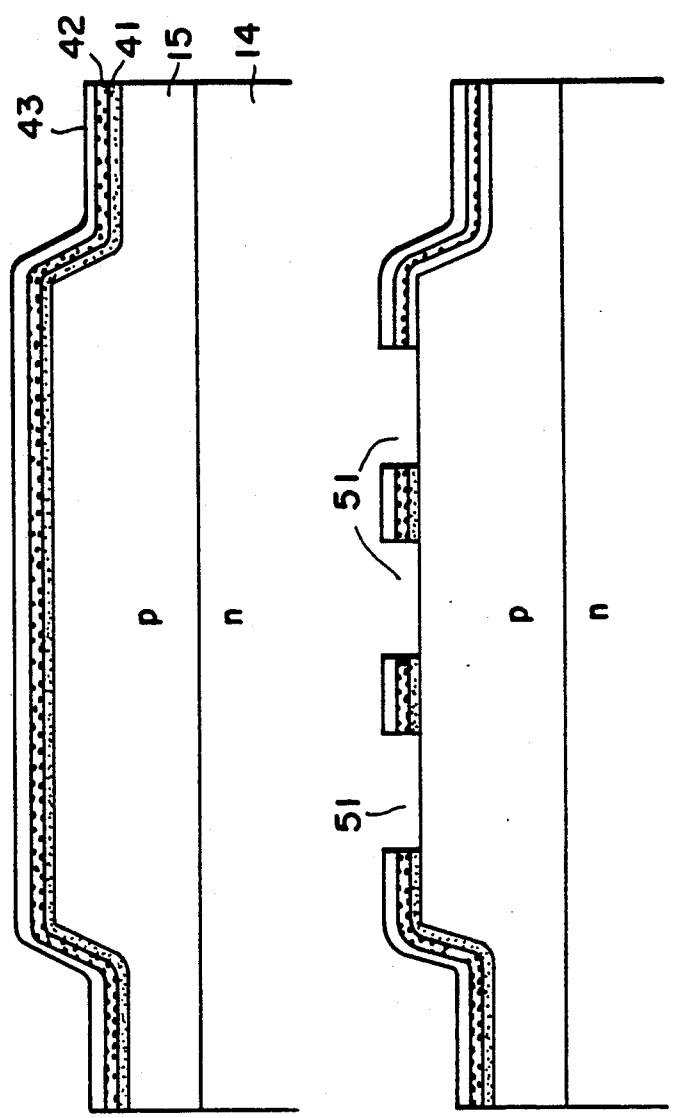

TURN OFF TYPE SEMICONDUCTOR DEVICE, METHOD OF PRODUCING THE SAME AND THE POWER CONVERSION APPARATUS EMPLOYING THE SAME

BACKGROUND OF THE INVENTION

The present invention relates to a turn off type semiconductor device and more particularly to a turn off type semiconductor device suitable for a high speed switching operation and an increase in a controllable current, a method of the same and the power conversion apparatus employing the same.

By the request of heightening an operating frequency an increasing a power in a power conversion apparatus such as an inverter, it is desired to develop a switching device which is capable of cutting off a large current at a high speed. As a typical switching device, there is given a GTO (gate turn off type) thyristor which is capable of turning on or off by receiving a gate signal. In general, the magnitude of a controllable current of the GTO thyristor is in inverse proportion to a gate impedance ($r_G$) and is in proportion to a reverse breakdown voltage ($BV_{GK}$) across a gate and a cathode. In other words, if $r_G$ is decreased to heighten $BV_{GK}$, it is possible to increase the controllable current. Moreover, increasing $r_G$ to heighten $BV_{GK}$ allows carriers in a base layer to be extracted at a high speed, and therefore, it is none other than the operation capable of turning off at a high speed. If a realistic device structure is considered, there is a limit in increasing $BV_{GK}$ from a relation to and on voltage and turn on characteristics. In this connection, the most important point for making an operation speed higher and making a current larger is that $r_G$ is decreased to the limit.

In order to solve the above problem, as disclosed in JP-A-62-147769 (the term JP-A used herein means that the patent application was laid open to public inspection but has not been examined), there has been proposed a GTO thyristor in which a low impurity concentrated p-type base layer is provided in a p-type base layer at the side of an n-type emitter layer, and a high impurity concentrated p-type layer used for gate contact is provided so as to be in contact with a highest impurity concentrated region of said p-type base layer. With this thyristor, a gate impedance is intended to be reduced by the so-called buried p+-type gate structure in which a high impurity concentrated p-type layer is buried in a low impurity concentrated p type base layer under an n-type emitter layer using the epitaxial growth technique.

SUMMARY OF THE INVENTION

An object of the present invention is to provide a turn off type thyristor and a method of producing the same which can realize high speed switching operations and an increase of a controllable current by decreasing a gate impedance to the minimum limit while maintaining a large occupation rate of an n-type emitter.

Another object of the present invention is to provide a power conversion apparatus which is capable of realizing a higher frequency operation and miniaturization.

In order to reduce the gate impedance of the GTO thyristor to the limit without degrading the on characteristics thereof, it is necessary to simultaneously decrease both a resistance between a gate electrode in the p-type base layer and an edge projecting portion of the n-type emitter layer (extrinsic gate resistance), and a transverse resistance of the p-type base layer in an area through which an anode current flows (intrinsic gate resistance). Out of these resistances, the decrease of the latter can be attained only by making the width of the n-type emitter small. In the prior art, however, the decrease of both the above-mentioned two resistances was not sufficiently attained. More specifically, the buried p+-type layer is made of a semiconductor material, so that however high the impurity concentration is made to be, its sheet resistivity is at more 10 $\Omega/\square$ or so. Therefore, it is difficult to decrease the extrinsic gate resistance between the gate electrode and the edge of the emitter layer. In addition thereto, there arises a problem in that an auto-doping of p-type impurities into a growing layer during the epitaxial growth makes a distance between the buried p+-type layers (i.e., an area under the n-type emitter layer, having no p+-type layer) short. As a result, in the distance between the buried p+-type layers, the fining limit is about 50 $\mu m$ in a design dimension, and there is also the limit in decreasing the intrinsic gate resistance. Moreover, in relation to the above-mentioned problem, in the buried p+-type layer, an area overlapping with the n-type emitter layer is necessarily large. This overlapping area has no anode current flowing therethrough, and therefore, it is an unnecessary portion in terms of the operation of the device. In other words, there arises a problem in that the n-type emitter layer cannot be made to be fine and also a substantially effective area ratio according for the n-type emitter layer percent of the whole device (occupation rate of the n-type emitter) becomes small, so that the controllable current cannot be made to be sufficiently large.

Accordingly, with the method employing the above-mentioned prior art, there is the limit in reducing the gate impedance, and the occupation rate of the n-type emitter is small. As a result, this becomes a problem for making the operation speed of the thyristor higher an increasing the used current.

In the mean time, for the purpose of increasing a block gain (ratio of an anode voltage to a gate voltage required for blocking operation), there has been proposed a static induction type (SI) thyristor, in which the width of an n-type emitter is divided finely, disclosed in JP-A-61-100966 and IEDM'84-439-442. However, this method is not sufficient in the respects of further reducing the gate impedance and of improving the occupation rate of the n-type emitter. According to the method of forming a gate electrode of the SI type thyristor, as apparent from the producing method described with reference to FIG. 7 of the above provisional publication, each of trenches in a gate region for dividing an n-type emitter layer is formed in an overhang shape with respect to the n-type emitter layer, and the gate electrode is formed by a directional evaporation of Al with being separated from the emitter electrode in a self-aligned manner. In this method, however, there is well known a low production yield. Moreover, a horizontal distance between the gate electrode and the n-type emitter layer is basically large, and as a result, an area occupied by the gate electrode is increased. For this reason, the above-mentioned problem cannot be overcome.

It is therefore an object of the present invention to provide a turn off type thyristor and a method of producing the same which enable a high speed switching operation and an increase of a controllable current to be realized by decreasing a gate impedance to the limit while maintaining a large occupation rate of an n-type emitter.

It is another object of the present invention to provide a power conversion apparatus which is capable of realizing a higher frequency operation and miniaturization.

The feature of a turn off type semiconductor device for attaining the foregoing one object is that an outside layer on the side of a portion in which a control electrode is to be provided is divided into a number of elements by trenches deeper than the outside layer, each of the individual elements obtained by the division is surrounded by a silicide layer of a high melting point metal provided on a bottom of each of the trenches, and the individual elements are grouped by a plurality of ones so that they are surrounded by the control electrode provided on the associated silicide layer of a high melting point metal. In each of portions of an intermediate layer adjacent to the outside layer which is exposed from the bottom of each of the trenches on which the silicide layer of a high melting point metal is provided, a high impurity concentrated region is provided. This high impurity concentrated region has the same conductivity type as that of the intermediate layer in the case of a GTO thyristor, and has an opposite conductivity type to that of the intermediate layer in the case of an SI thyristor.

Moreover, for attaining the foregoing one object, a method of producing the turn off type semiconductor device is characterized by comprising the steps of: forming trenches deeper than an outside layer on the side of a portion in which a control electrode is to be provided to divide the outside layer into a plurality of elements; forming a silicide layer of a high melting point metal on a bottom of each of the trenches in a self-aligned manner; and forming a control electrode on the associated silicide layer of a high melting point metal, with the individual elements of the outside layer being grouped by a plurality of ones, so as to surround the groups of individual elements.

Further, the feature of a power conversion apparatus for attaining another object of the present invention is that the turn off type semiconductor device is used as a switching device constituting an inverter or a converter.

According to the turn off type semiconductor device having such a construction, the device is arranged in such a way that the outside layer surrounded by the control electrode is divided into a plurality of elements an each of the individual elements is surrounded by the silicide layer of a high melting point metal. Therefore, a unit turn off type semiconductor device (device having therein the individual elements obtained by the division as its outside layer) has a small area, and the gate impedance becomes small, so that the controllable current can be increased. When the controllable current is fixed, a switching speed can be increased.

Moreover, since the silicide layer of a high melting point metal can be formed in a narrow portion of the bottom of each of the trenches in a self-aligned manner, the width of the trench can be made to be small as much as possible, and the occupation rate of the n-type emitter can be increased.

Further, when the turn off type semiconductor device of the present invention is used as a switching device for the power conversion apparatus, it is possible to realize a higher frequency operation and miniaturization of the power conversion apparatus.

According to the present invention, the width of each of the individual elements of the n-type emitter layer can be sufficiently made to be a fine size while maintaining a large occupation rate of the n-type emitter, and the gate impedance can be decreased to the limit. Therefore, there is provided an effect in that a controllable current of a turn off type semiconductor device can be increased and a switching operation can be carried out at a high speed.

BRIEF DESCRIPTION OF THE DRAWINGS

FIGS. 5A to 5D are cross sectional views showing steps of a method of producing the GTO thyristor shown in FIG. 4;

DESCRIPTION OF THE REFERRED EMBODIMENT

Embodiments of the present invention will hereinafter be described in detail with reference to the accompanying drawings.

Figure 1:
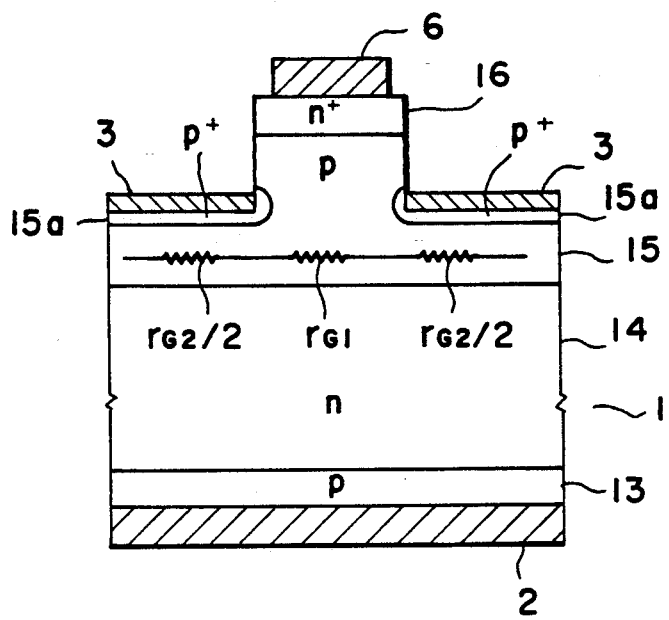
FIG. 1 is a cross sectional view showing a basic segment of a GTO thyristor according to the present invention.

FIG. 1 is a cross sectional view showing one embodiment of a basic segment of a GTO thyristor according to the present invention. The basic segment of a GTO thyristor has a four layer structure made up of a p-type emitter layer 13, an n-type base layer 14, a p-type base layer 15 and an n-type emitter layer 16. In the basic segment, a silicide layer of a high melting point metal, e.g., a titanium silicide ($TiSi_2$) layer 3 is formed on a surface of the p-type base layer 15, which is obtained by etchdown substantially vertical to a surface of the n-type emitter 16, in a self-aligned manner with respect to the vertical surface formed by the etchdown; a high impurity concentrated p-type region 15a is formed in the vicinity of the surface of the p-type base layer 15 which is adjacent to the silicide layer; and a cathode electrode 6n made of an aluminum (Al) series metal film and an anode electrode 2 made of an Al series metal film are formed on the n-type emitter layer 16 and on the p-type emitter layer 13, respectively, in an ohmic connection manner.

Since the $TiSi_2$ layer 3 on the surface of the p-type base layer 15 is formed in a self-aligned manner with respect to the vertical surface of the p-type base layer 15 obtained by the etchdown, no horizontal distance is present between the layer 3 and the n-type emitter layer 16, and the resistance of the layer 3 is sufficiently small. Therefore, the layer 3 functions effectively as a part of a gate electrode. For example, if the thickness of the layer 3 is 300 nm, the sheet resistivity is about 0.5 $\Omega/\square$. As a result, an extrinsic gate resistance ($r_{G2}$) can be decreased to 1/20 in comparison with the case employing the prior art buried p-type layer. Moreover, the high impurity concentrated p-type layer 15a may have a thickness of the order of 0.5 $\mu$m since it is sufficient to maintain an ohmic contact between the TiSi$_2$ layer 3 and the p-type base layer 15. Therefore, the penetration of the high impurity concentrated p-type layer 15a into a portion below the n-type emitter layer 16 is small, i.e., about the depth of diffusion (e.g., 0.5 $\mu$m) of the high impurity concentrated p-type layer 15a, so that the whole surface of the n-type emitter layer 16 functions effectively as an emitter. For this reason, the width of the n-type emitter layer 16 can be made to be a small size less than a several $\mu$m, and an intrinsic gate resistance ($r_{G1}$) can be decreased to 1/10 or less of the prior art case. As a result, the controllable current of the thyristor can be improved by several times to one order, and if the increase of the controllable current is controlled, the switching operation can be carried out at a high speed of more than one order in comparison with the prior art.

Figure 2:
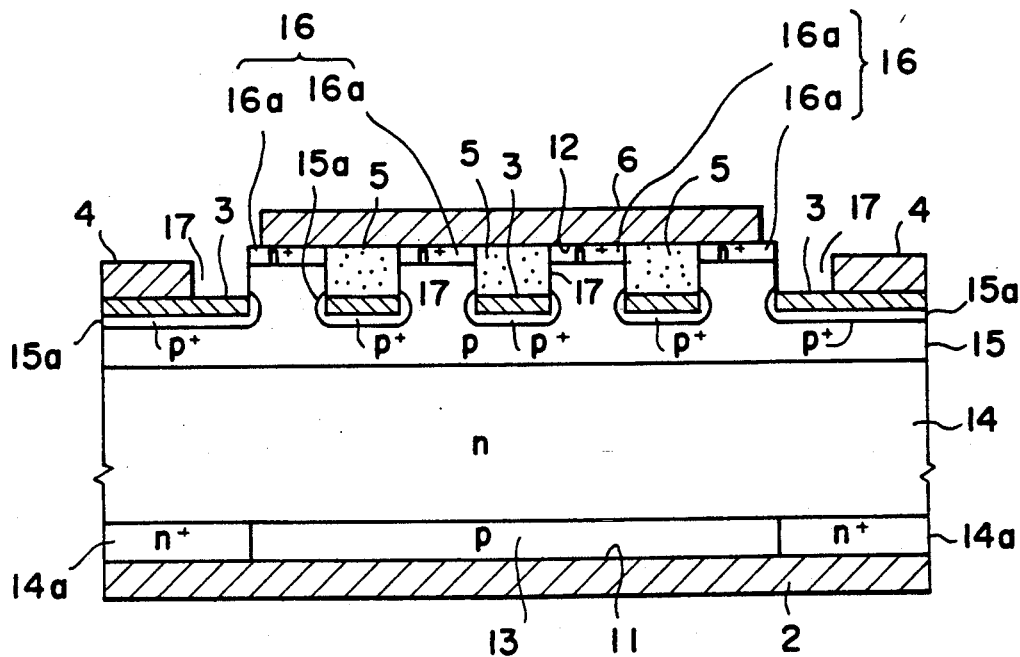
FIG. 2 is a cross sectional view showing one embodiment of the GTO thyristor which is constructed by arranging a plurality of basic segments one of which is shown in FIG. 1.

By integrally arranging a number of basic segments one of which is typically shown in FIG. 1, it is possible to realize a GTO thyristor. FIG. 2 is a cross sectional view showing one embodiment of a GTO thyristor which is constructed by integrally arranging a number of basic segments.

In the figure, the reference numeral 1 designates a semiconductor substrate body having therein a pair of main surfaces 11 and 12. This substrate body has therein the p-type emitter layer 13 adjacent to one main surface, the n-type base layer 14 adjacent to the p-type emitter layer 13, the p-type base layer 15 adjacent to the n-type base layer 14, and the n-type emitter layer 16 adjacent to both the p-type base layer 15 and the other main surface 12, and has therein on the other main surface 12 trenches 17 which are deeper than the n-type emitter layer 16 and divide the n-type emitter layer 16 into a plurality of elements 16a. The high impurity concentrated p-type layer 15a is formed in the vicinity of a surface of the p-type base layer 15 which is exposed from a bottom of each of the trenches 17, and a high impurity concentrated n-type layer 14a is formed between each of the selected portions of the n-type base layer 14 and one main surface 11. The reference numeral 2 designates an anode electrode which is formed on one main surface 11 so as to be in ohmic contact with both the p-type emitter layer 13 and the individual high impurity concentrated n-type layers 14a. The reference numeral 3 designates a silicide layer of a high melting point metal such as TiSi$_2$ which is formed on the bottom of each of the trenches 17 so as to extend over the whole width thereof. The reference numeral 4 designates a gate electrode made of an Al series metal which is formed on the associated silicide layer 3 of a high melting point metal so as to surround the plural elements 16a of the n-type emitter layer 16 as one group. The reference numeral 5 designates an insulator which is filled in each of the trenches 17 located within the group of elements, and the reference numeral 6 designates a cathode electrode which is in ohmic contact with the individual elements 16a of the n-type emitter layer 16 an extends over the individual insulators 5. An actual GTO thyristor is arranged in such a way that the structure shown in FIG. 2 is treated as a repeating unit and a number of ones are provided integrally. In this connection, the width of each of the trenches 17 within the group is substantially equal to that of each of the elements 16a of the n-type emitter layer 16, whereas the width of the trench 17 located between the groups is several times as wide as that of each of the elements 16a of the n-type emitter layer 16 for the necessity of forming the gate electrode 4 thereon.

In the present embodiment, the TiSi$_2$ layer 3 connected to the gate electrode 4 surrounds the individual elements 16a of the n-type emitter layer 16 within the group with no provision of a horizontal distance to continuously extend, and therefore, even if the geometry of the basic segment is fined to the limit, the extrinsic gate resistance can be sufficiently reduced to a small value and the intrinsic gate resistance can be also sufficiently decreased. Further, since the width of each of the trenches can be made to be a small size with the same scaling as the width of each of the elements 16a of the n-type emitter layer 16, the value of the occupation rate of the n-type emitter can be always maintained at 30 to 50% without the occupation rate being lowered. In this connection, the individual elements of the finely-divided n-type emitter layer are operated uniformly, and there hardly arises a problem in that a current is concentrated on a portion between the elements confronting with each other and a central portion of each of the elements during the turn off operation. Accordingly, a large current can be cut off at a high speed.

FIGS. 3A–3H are a cross sectional views useful in explaining steps of a method of producing the GTO thyristor shown in FIG. 2.

Figure 3A:
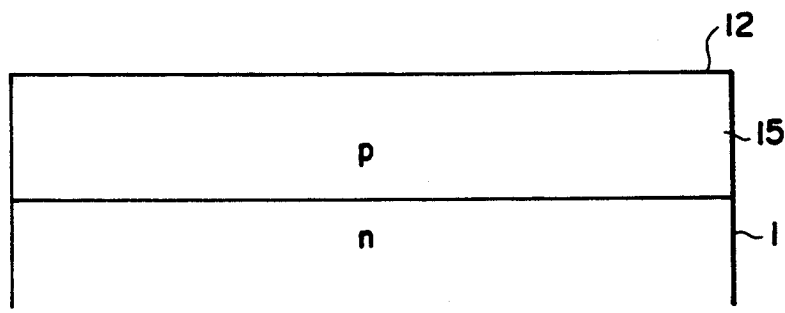
FIGS. 3A to 3H are cross sectional views useful in explaining steps of a method of producing the GTO thyristor shown in FIG. 2.
Figure 3B:
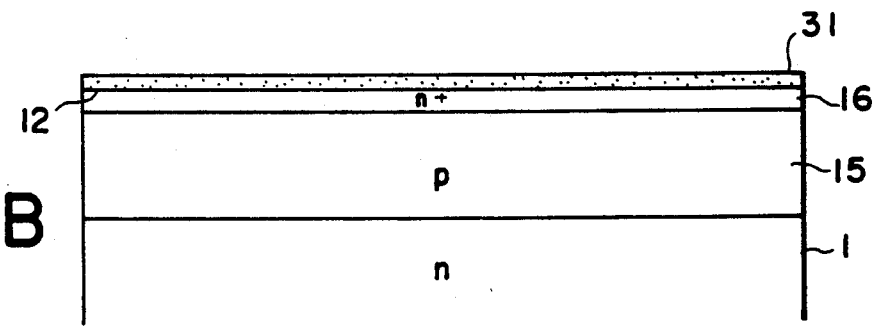
Figure 3C:
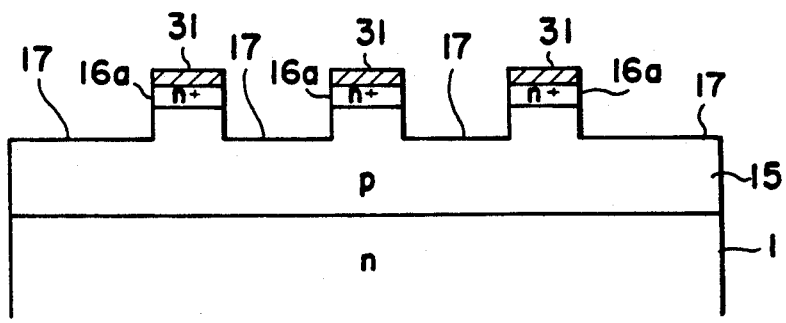
Figure 3D:
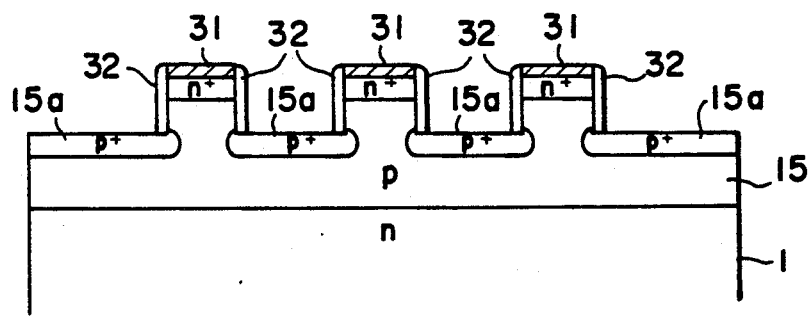
Figure 3E:
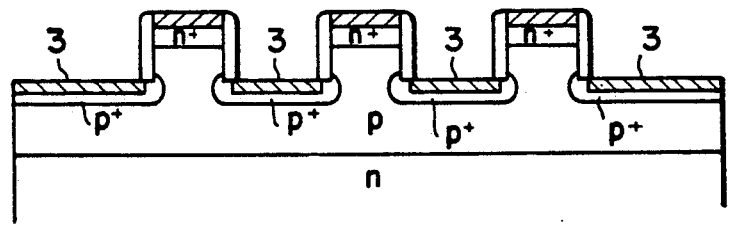
Figure 3F:
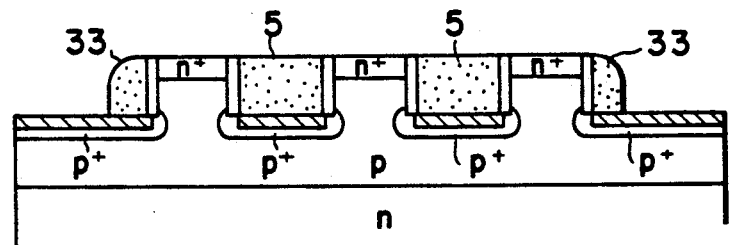
Figure 3G:
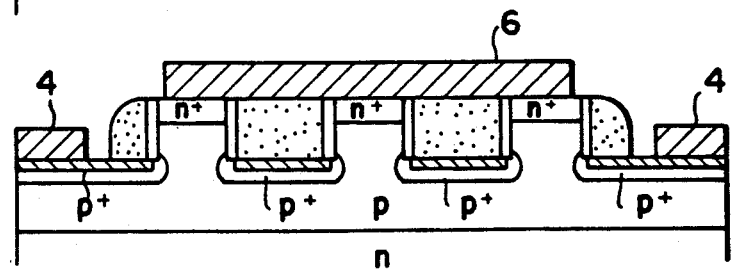

In production, the n-type semiconductor substrate 1 is first prepared, and gallium is diffused from the main surface 12 of the substrate to form the p-type base layer 15 with a depth of about 70 $\mu$m (refer to FIG. 3A). Subsequently, phosphorus is diffused from the main surface 12 to form the n-type emitter layer 16 with a depth of about 5 $\mu$m. For the next process, a silicon oxide film 13 is deposited on the main surface 12 by the chemical vapor deposition (CVD) method (refer to FIG. 3B). Then, the trenches 17 with a depth of about 20 $\mu$m which extends from the main surface 12 into the p-type base layer 15 by the photoetching technique (refer to FIG. 3C). The n-type emitter layer 16 is divided into a number of elements 16a by the formation of the trenches 17. In this connection, with the trenches 17 (two trenches being located at a central portion in the figure) within an area which will be treated as one. group later, the width thereof is small, while with the trench 17 (being located on the both sides in the figure) which is arranged between the groups, the width thereof is large. A silicon oxide film with a thickness of about 50 nm is then formed on at least an internal surface of each of the trenches 17 by the CVD method or the thermal oxidation method and the silicon oxide film 32 is left only on a side wall of each of the trenches 17 by treating the silicon oxide film with the anisotropic dry etching technique, thereby to expose the surface of the p-type base layer 15 from the bottom of each of the trenches 17. Boron ions of $1\times10^{16}$ cm$^{-2}$ are implanted into each of the exposed portions of the p-type base layer 15, and with a heat treatment the high impurity concentrated p-type layers 15a are formed on the surface of the p-type base layer (refer to FIG. 3D). Subsequently, a metallic titanium (Ti) film with a thickness of 120 nm is deposited on the whole surface of the substrate body by the sputtering technique, and thereafter, a heat treatment is performed at a temperature of 600° C. for 30 sec by the lamp annealing method to form TiSi$_2$ only on the surface of each of the p$^+$-type layers 15a in a self-aligned manner. Then, the unreacted Ti is removed by a mixed solution of a hydrogen peroxide and an aqueous solution of ammonia (refer to FIG. 3E). As a result, the TiSi$_2$ layer 3 and each element 16a of the n-type emitter layer 16 are controlled at a high yield to be apart from each other by a fine gap which is defined by a horizontal distance of the silicon oxide film 32 on the side wall of each trench 17. Thereafter, a silicon oxide film with a thickness allowing each of the trenches 17 to be completely filled therewith is deposited by the CVD method for example, and then is etched by the anisotropic etching technique. Thus, the insulator 5 which is substantially flattened within each of the narrow trenches and the insulator 33 which is deposited only on the side wall of the wide trench are left, so that the surface of each of the elements 16a of the n-type emitter layer 16 and a part of the surface of the TiSi$_2$ layer 3 are exposed (refer to FIG. 3F). Subsequently, after Al with a thickness of about 10 μm is deposited on the whole surface of the substrate body by the sputtering method, by using the photoetching technique, the cathode electrode 6 is formed on the individual elements 16a of the n-type emitter layer 16 and the individual insulators 5, and at the same time the gate electrode 4 is formed on the exposed portion of the TiSi$_2$ layer 3 so as to surround the cathode electrode 6. Thus, the main producing processes of the GTO thyristor are completed (refer to FIG. 3G).

Figure 3H:
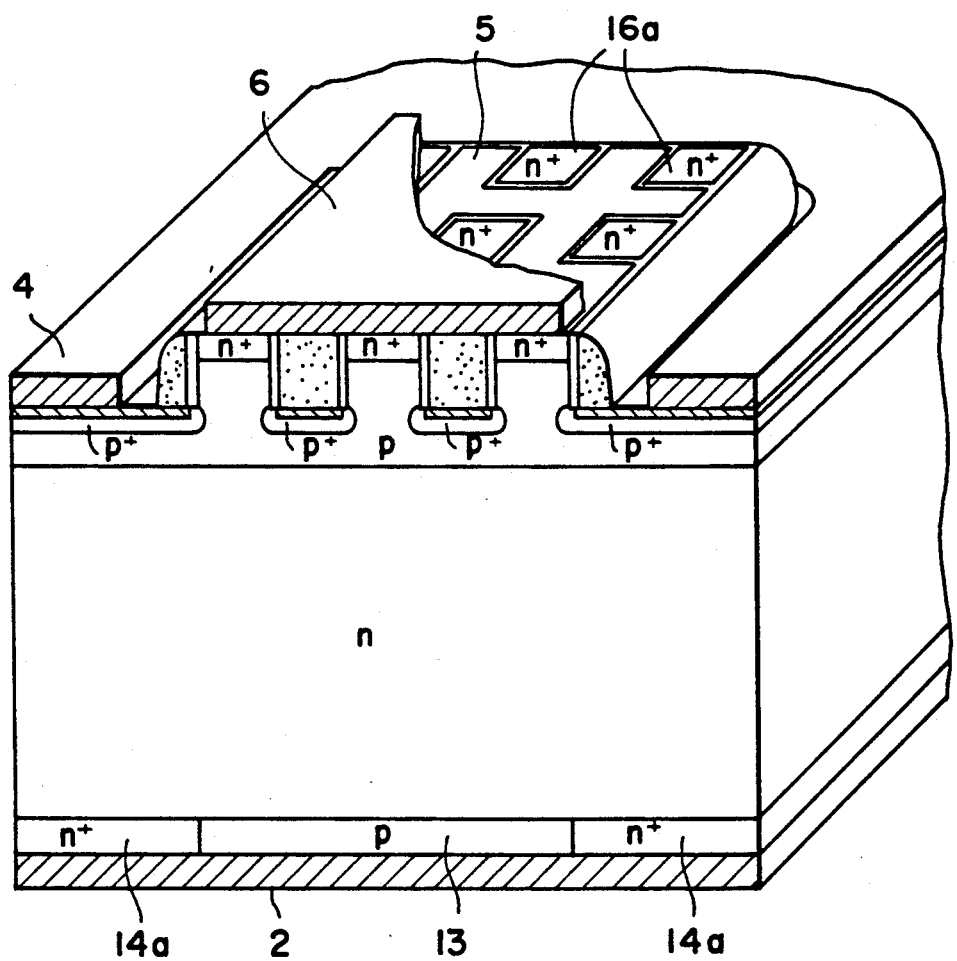

FIG. 3H is a bird's-eye view showing a unit of the GTO thyristor which is produced in accordance with the above main producing processes. Incidentally, for the purpose of illustrating a pattern state of the n-type emitter layer 16, the cathode electrode 6 is partially broken away.

With the GTO thyristor according to the present embodiment, for the reason described with reference to FIG. 2, there is provided an effect in that the switching frequency can be heightened and the controllable current can be increased. In addition thereto, there is also provided an effect in that especially, the TiSi$_2$ layer 3 serving as a first gate electrode can be formed stably at a high yield.

Incidentally, in the present embodiment, the silicon oxide film is used as the insulating film 5 for flattening each of the trenches. But, it should be noted that alternatively, an insulating polysilicon film may be used, or a lamination film consisting of a silicon oxide film and a polysilicon film may be also used.

Figure 4:
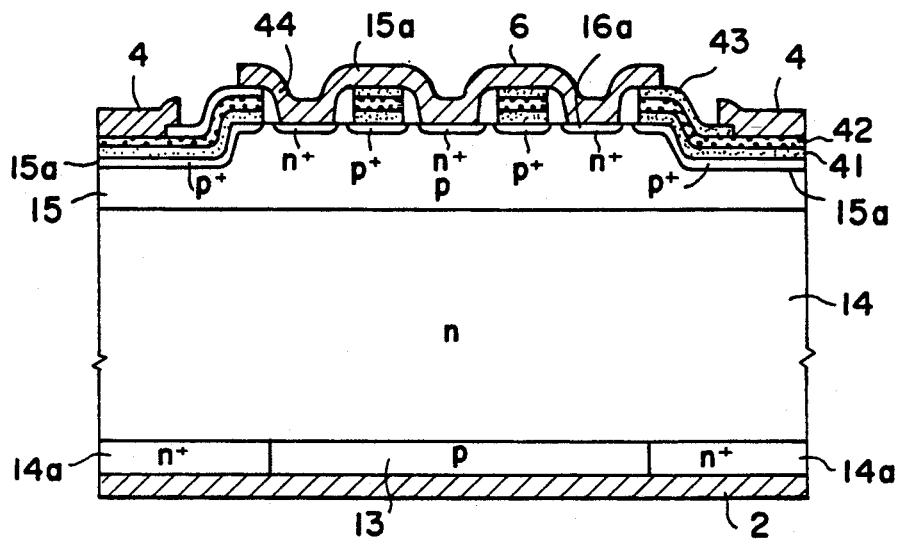
FIG. 4 is a cross sectional view showing another embodiment of the present invention.

FIG. 4 is a cross sectional view showing another embodiment of the present invention. The present embodiment is different from the embodiment shown in FIG. 2 in the construction on the side of the cathode electrode. More specifically, the present embodiment has a construction in which a periphery of a surface of a p-type base layer 15 is etched down; an element 16a of an n-type emitter layer 16 and a high impurity concentrated p-type layer 15a are alternately disposed at a central portion; the periphery has only the high impurity concentrated p-type layer 15a formed therein; a three layer lamination structure made up of a polycrystalline film 41 doped with p-type impurities, a WSi$_2$ film 42 and a silicon oxide film 43 is formed on the high impurity concentrated p-type layer 15a; a silicon oxide film 44 is formed on each of side walls of the three layer lamination structure; a cathode electrode 6 is formed on the elements 16a of the n-type emitter layer 16, the silicon oxide films 44, and the three layer lamination structure; and a gate electrode 4 is formed on an exposed portion of the WSi$_2$ film 42 in the periphery.

In the present embodiment, the lamination structure made up of the WSi$_2$ film 42 connected to the gate electrode 4 and the polysilicon film 41 surrounds the individual elements 16a of the n-type emitter layer 16 within the unit to continuously extend, and therefore, even if when width of each of the elements 16a of the n-type emitter layer 16 and that of a portion between the two elements 16a confronting with each other are made to be small to the limit, the extrinsic gate resistance can be sufficiently reduced to a small value. As a result, the intrinsic gate resistance can be also sufficiently decreased. Accordingly, the individual elements of the finely-divided n-type emitter layer are uniformly operated, and there does not arise a problem of a current concentration on a portion between the elements confronting with each other and a central portion of each of the elements during the turn off operation. This provides an effect in that a large current can be cut off at a high speed. Moreover, according to the present embodiment, since the individual elements 16a of the n-type emitter layer 16 are provided in the opening areas of the three layer lamination structure which is provided above the surface of the p-type base layer 15, the deep trenches for dividing the n-type emitter layer in an insular arrangement are unnecessary and it is needles to fill each of the trenches with the insulator as in the above-mentioned embodiment. Accordingly, there are provided effects in that the producing method becomes easy, and also the width of the n-type emitter layer can be readily made to be finer. Moreover, a gap between the high impurity concentrated p-type layer 15a and each of the individual elements 16a of the n-type emitter layer 16 is defined by a horizontal distance of the silicon oxide film 44 provided on each of the side walls of the three layer lamination structure, and therefore, there is provided an effect in that the extrinsic gate resistance can be sufficiently decreased while maintaining a desired gate reverse breakdown voltage. Further, since the gate electrode 4 is provided on the periphery of the p-type base layer 15 which is formed by the etch-down from the main surface of the p-type base layer 15, it is possible to directly use the prior art packaging technique.

Incidentally, in the present embodiment, the n-type emitter layer 16 is provided on the surface of the p-type base layer 15. But, alternatively, for the purpose of further improving the gate reverse breakdown voltage, the n-type emitter layer 16 may be in a trench which is obtained by digging deeply into the p-type base layer 15 by a several μm or so.

An actual GTO thyristor is arranged in such a way that the structure shown in FIG. 4 is treated as a repeating unit and a number of such structures are disposed integrally.

FIG. 5 is a cross sectional view showing steps of a method of producing the GTO thyristor shown in FIG. 4. A semiconductor substrate body is first prepared in which the p-type base layer 15 is formed on the n-type base layer 14 and the periphery of the surface of the p-type base layer 15 is treated with the etchdown. On the surface of the p-type base layer 15, the polysilicon film 41 of 200 nm thickness which is heavily doped with boron, the WSi$_2$ film 42 of 300 nm thickness and the silicon oxide film 43 of 1000 nm thickness are deposited in this order using the CVD technique, thus forming the three layer lamination structure (refer to FIG. 5A).

Figures 5C, 5D:
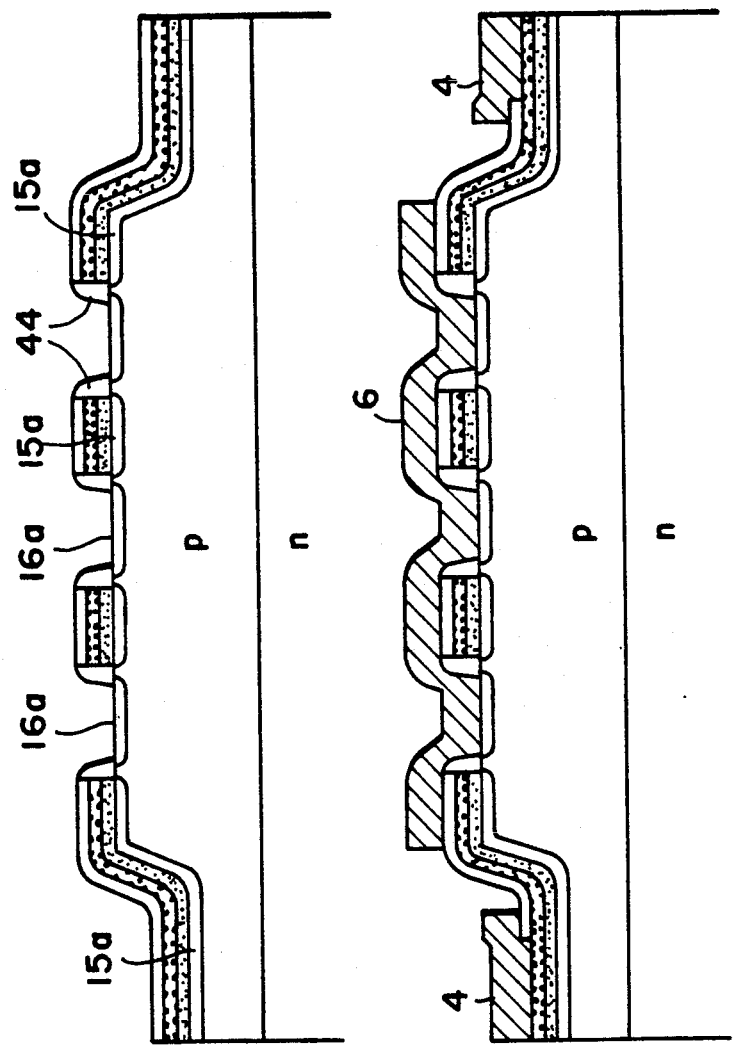

Subsequently, by using the photoetching technique, these films 41, 42 and 43 are processed to form openings 51 on the surfaces of the areas in which the elements 16$a$ of the n-type emitter layer 16 and the high impurity concentrated p-type layers 15$a$ are to be formed (refer to FIG. 5B). Then, after a silicon oxide film of 1000 nm thickness is deposited on the whole surface of the substrate body using the CVD technique, the silicon oxide film is etched by the anisotropic dry etching technique, thereby to provide the silicon oxide film 44 with a transverse thickness of about 1 $\mu$m on each of the side walls of the openings of the three layer lamination structure. Then, p-type ions are selectively implanted from the openings 51 into the p-type base layer 15 by the ion implantation technique, and thereafter, the heat treatment is performed to form the individual elements 16$a$ of the n-type emitter layer 16, and to diffuse boron (B) contained in the polysilicon layer 41 into the p-type base layer 15, thereby to form the high impurity concentrated p-type layer 15$a$ (refer to FIG. 5C). Then, a portion of the silicon oxide film 43 of the three layer lamination structure located in the periphery is removed using the photoetching technique. Thereafter, Al.Si of 10 $\mu$m thickness is deposited on the whole surface of the substrate body using the sputtering method to be divided into a peripheral portion and a central portion. Thus, the cathode electrode 6 linking the individual elements 16$a$ of the n-type emitter layer 16 and the gate electrode 4 coupled to the WSi$_2$ film 42 are formed, thereby to construct the main portions of the GTO thyristor (refer to FIG. 5D).

Figure 6A:
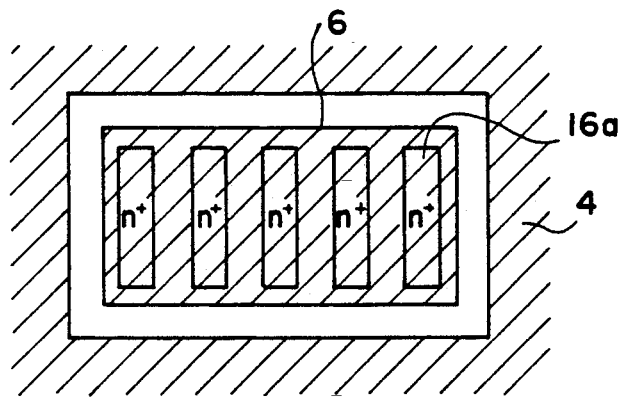
FIGS. 6A and 6B are plan views showing examples of a plane pattern of the GTO thyristor shown in FIG. 5.
Figure 6B:
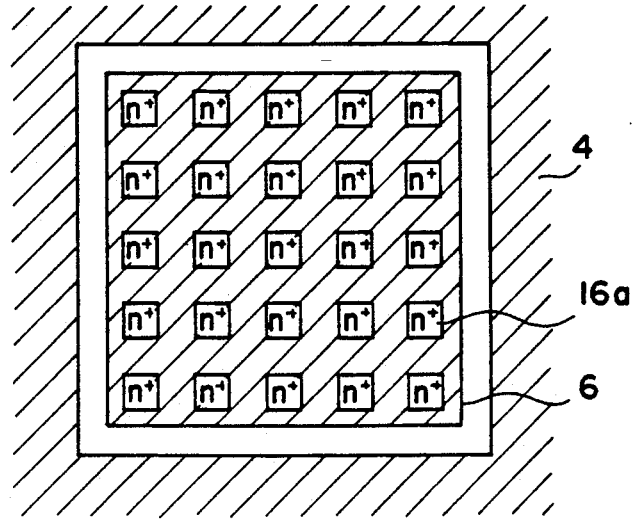

FIG. 6 is a plan view showing examples of a plane pattern of the GTO thyristor shown in FIG. 4. One unit may be constructed in such a way that the individual elements 16$a$ of the n-type emitter layer 16 which are obtained by the division as in FIG. 6A and each of which has a stripe shape are arranged in a row. Alternatively, it may be constructed in such a way that the n-type emitter layer 16 is formed in a square shape and the individual elements thereof are disposed in a two dimensional arrangement. In any case, there can be accomplished an effect inherent in the present invention. Moreover, these plane patterns may be directly applied to the embodiments of FIG. 2 and FIG. 3. Further, even when a plurality of units one of which is typically described above are provided on the same substrate to construct one thyristor, there can be accomplished an effect of the present invention.

Figure 7:
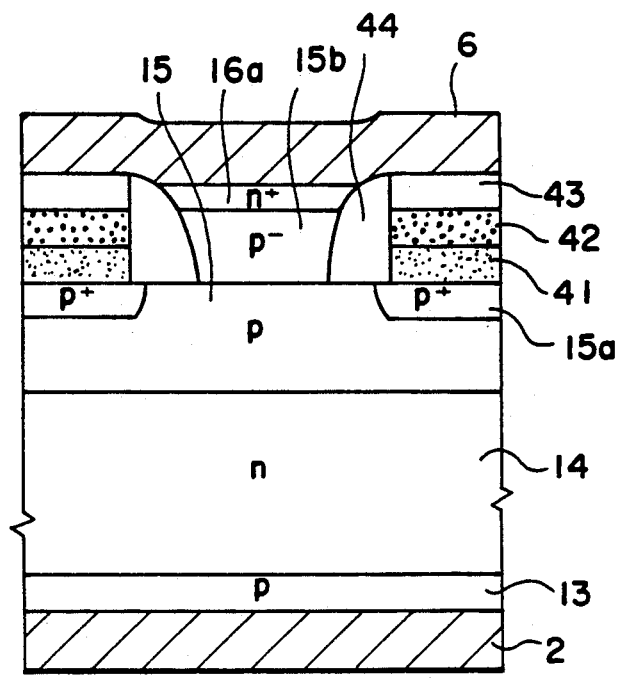
FIG. 7 and FIG. 8 are cross sectional views showing modifications of the GTO thyristor shown in FIG. 4, respectively.

FIG. 7 is a cross sectional view showing a basic segment of a modification of the embodiment shown in FIG. 4. A p$^-$-type layer 15$b$ having an impurity concentration lower than a peak impurity concentration of the p-type base layer 15 is provided in the opening surrounded by the three layer lamination structure by the epitaxial growth technique for example, and the element 16$a$ of the n-type emitter layer 16 is provided on the surface of the p$^-$-type layer 15$b$. Such a construction allows an electrical field during the reverse bias applied across the gate and cathode to be weakened, and therefore, there is provided an effect in that the gate reverse breakdown voltage can be greatly improved. Incidentally, even if the p$^-$-type layer is replaced with an n$^-$-type layer, there can be accomplished the same effect.

Figure 8:
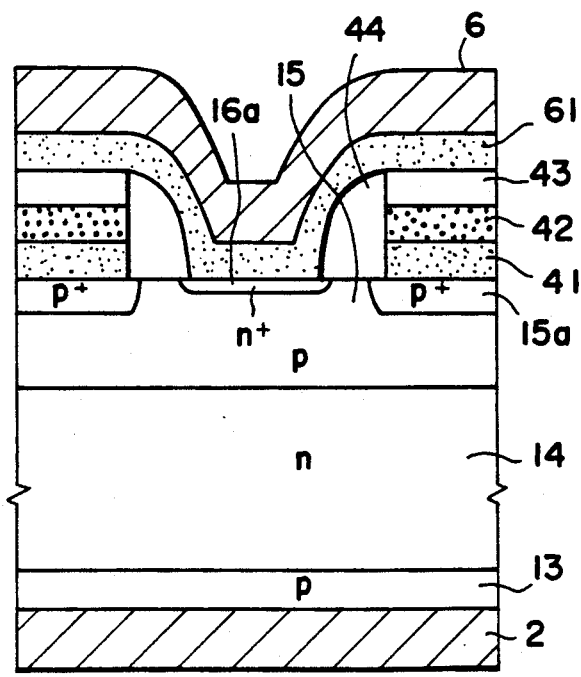

FIG. 8 is a cross sectional view showing a basic segment of another modification of the embodiment shown in FIG. 4. After the opening surrounded by the three layer lamination structure is provided, a polysilicon film is formed. Then, p-type ions are implanted into the polysilicon film and a heat treatment is carried out to form the element 16$a$ of the n-type emitter layer 16 and an n$^+$-type polysilicon film 61. Such a construction allows a shallow n-type emitter to be formed with defects or the like being controlled, and therefore, it is advantageous for making the width of the n-type emitter layer to be fine. Moreover, since even when the n-type emitter layer is made to be shallow, the n$^+$-type polysilicon film 61 also serves as an emitter region, there is provided an effect in that a current amplification factor of an npn type transistor can be increased.

Figure 9:
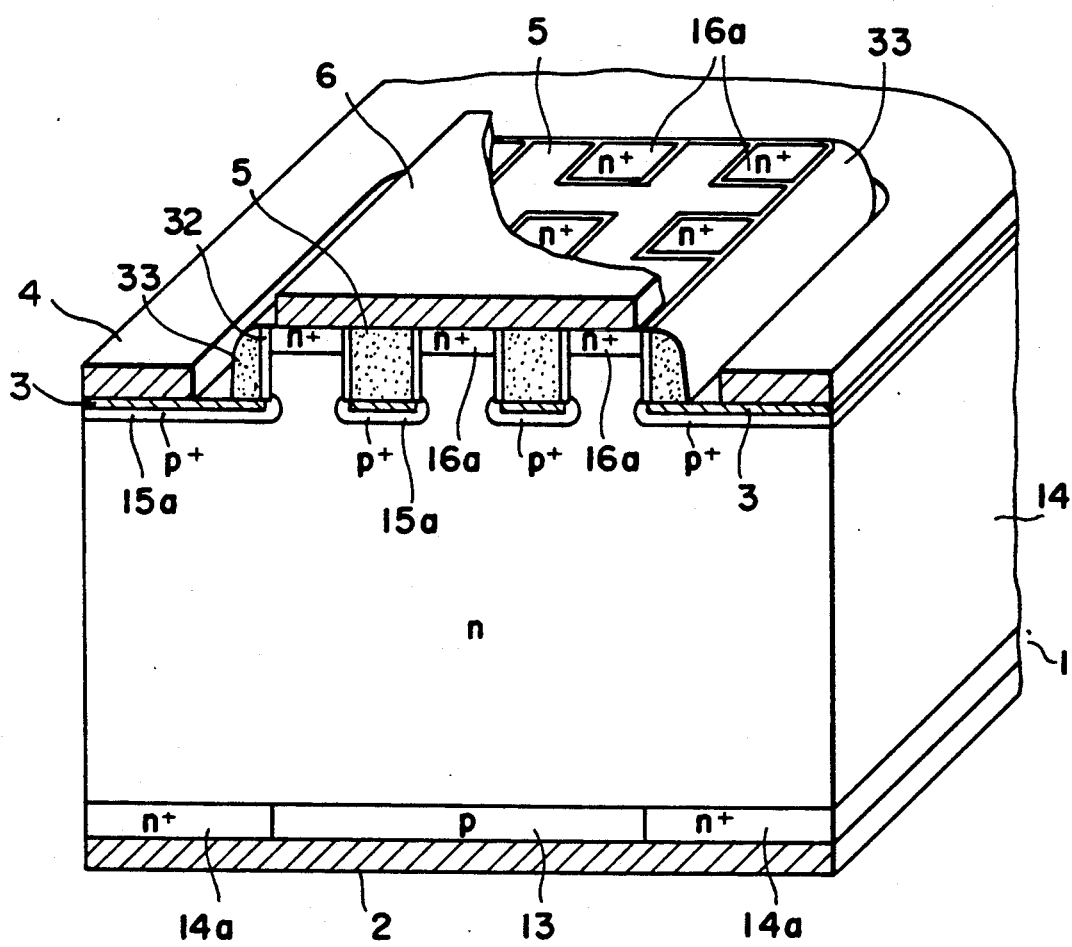
FIG. 9 is a bird's-eye view showing a unit of an SI thyristor to which the present invention is applied.

In the above-mentioned embodiments, the description has been given with respect to the GTO thyristor of a pnpn type structure. Alternatively, however, a pnipn type structure may be used. Further, the present invention can be applied to any turn off type semiconductor device other than the GTO thyristor. FIG. 9 is a bird's-eye view showing an example of a unit of a static induction type (SI) thyristor to which the present invention is applied. Incidentally, the cathode electrode is partially broken away for the purpose of illustrating a pattern state of the n-type emitter layer 16. The description of a producing method thereof is omitted herein for brevity. However, with elimination of only the process of producing the p-type base layer 15 shown in FIG. 3, the SI type thyristor can be basically produced by the same process as that of the GTO thyristor shown in FIG. 3. The basic structure is made up of the n-type base layer 14, the n-type emitter layer 16, the p-type emitter layer 13, the n$^+$-type shorted p-type emitter layer 14$a$, the high impurity concentrated p-type layer 15$a$, the TiSi$_2$ film 3, the silicon oxide film 32, the insulator 5, the cathode electrode 6 made of an Al.Si film, the gate electrode 4, and the anode electrode 2. The basic operation of the SI thyristor is such that when a reverse bias is applied across the gate and cathode, a depletion layer extends from the high impurity concentrated p-type layer 15$a$ to the n-type base layer 14 adjacent thereto to pinch off a portion between the two high impurity concentrated p-type layers confronting with each other, thereby to cut off the anode current. According to the construction of the present invention, since a distance between the two high impurity concentrated p-type layer 15$a$ confronting with each other (i.e., the width of the each of elements 16$a$ of the n-type emitter layer 16) can be readily made to be a small size less than 10 $\mu$m, a block gain (i.e., a ratio of the anode current to the gate voltage required for cutting off a current) can be sufficiently increased, and a high speed current cut off operation can be realized. Moreover, the width of the high impurity concentrated p-type layer 15$a$ dividing the n-type emitter layer 16 can be also readily made to be a small size equal to or less than that of each of the elements 16$a$ of the n-type emitter layer 16, and therefore, a large area of the n-type emitter layer 16 occupying the whole device can be sufficiently secured. For this reason, the SI thyristor in which a current capacity is also sufficiently large can be realized at a high yield.

As set forth hereinabove, the thyristor according to the present invention can cut off a large current at a high speed, and therefore, it is possible to attain improvement in performances of a power conversion apparatus.

Figure 10:
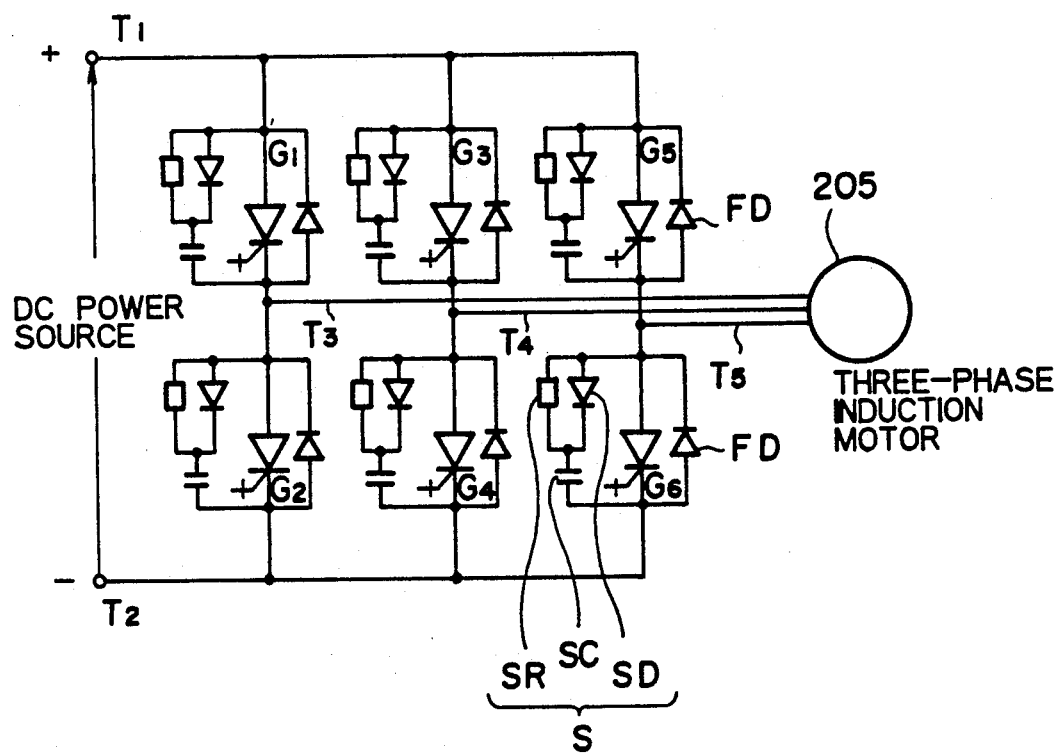
FIG. 10 is a circuit diagram showing an arrangement of an inverter apparatus for controlling an electric motor in which the GTO thyristor according to the present invention is utilized.

FIG. 10 is a circuit diagram showing one example in which an inverter apparatus for controlling an electric motor is constructed by utilizing the GTO thyristor according to the present invention. That is, there is shown an example in which a three-phase induction motor 205 is controlled by a voltage control type inverter circuit including therein six GTO thyristors. The basic circuit of the inverter is constructed in such a way that three series circuits each of which has the two GTO thyristors connected in series are connected in parallel between dc terminals $T_1$ and $T_2$, and ac terminals $T_3$, $T_4$ and $T_5$ are extended from middle points of the series circuits, respectively. To each of the GTO thyristors $G_1$, $G_2$, $G_3$, $G_4$, $G_5$ and $G_6$ is connected in parallel a fly-wheel diode FD and a snubber circuit S made up of a snubber diode SD, a snubber resistor SR and a snubber capacitor SC. By utilizing the GTO thyristor according to the present invention as a GTO thyristor, increasing a power and heightening an operation frequency of an inverter apparatus can be attained simultaneously. Accordingly, this is effective for making an inverter apparatus lighter and smaller, decreasing a loss and reducing a noise, and therefore, reducing the cost and improving an efficiency with respect to a system utilizing an inverter apparatus can be attained.

We claim:

1. A turn off type semiconductor device comprising:
   a semiconductor substrate body including an n-type emitter layer exposed at one main surface of said semiconductor substrate body and a p-type base layer underlying contiguously to said n-type emitter layer,
   said n-type emitter layer being divided into a plurality of groups by a plurality of first trenches which extend from the one main surface into said p-type base layer and which have a first width,
   each of said plurality of groups being divided into a plurality of segments by a plurality of second trenches which extend from the one main surface into said P-type base layer and which have a second width narrower than the first width;
   a plurality of silicide layers of a high melting point metal respectively formed over surfaces of bottoms of said first and second trenches in a self-aligned manner by side walls of said first and second trenches,
   said plurality of silicide layers being in electrical contact with said p-type base layer, each of said groups and each of said segments of said n-type emitter layer being surrounded by corresponding ones of said plurality of silicide layers,
   a plurality of gate electrodes respectively formed on said silicide layers which are formed on said plurality of first trenches so that each of said groups of said n-type emitter layer is surrounded by corresponding ones of said gate electrodes; and
   a cathode electrode formed on said n-type emitter layer in electrical contact with each of said segments thereof.

2. A turn off type semiconductor device comprising:
   a semiconductor substrate body including therein a pair of main surfaces, further having therein a first layer of one conductivity type adjacent to one of the main surfaces, a second layer of the other conductivity type adjacent to said first layer and having an impurity concentration lower than that of said first layer, a third layer of one conductivity type adjacent to said second layer, and a fourth layer of the other conductivity type adjacent to both said third layer and the other of said main surfaces and having an impurity concentration higher than that of said third layer, said fourth layer being divided into a plurality of groups by a plurality of first trenches each reaching said third layer and each having a first width, each of said groups being divided into a plurality of segments by a plurality of second trenches each reaching said third layer and each having a second width narrower than said first width;
   a plurality of silicide layers of a high melting point metal respectively formed over surfaces of bottoms of said first and second trenches in a self-aligned manner by side walls of said first and second trenches;
   a plurality of control electrodes respectively formed on said silicide layers which are formed on said plurality of first trenches so that each of said groups of said fourth layer is surrounded by corresponding ones of said control electrodes;
   one main electrode in ohmic contact with said first layer at said one main surface of said semiconductor substrate body; and
   another main electrode in ohmic contact with the individual segments of said fourth layer at the other main surface of said semiconductor substrate body.

3. A turn off type semiconductor device comprising:
   a semiconductor substrate body including therein a pair of main surfaces and further having therein a first layer of one conductivity type adjacent to one of the main surfaces, a second layer of the other conductivity type adjacent to said first layer and having an impurity concentration lower than that of said first layer, a third layer of the other conductivity type adjacent to both said second layer and the other of the main surfaces and having an impurity concentration higher than that of said second layer, a plurality of first trenches each extending from the other main surface towards the one main surface beyond said third layer and each having a first width so as to divide said third layer into a plurality of groups, a plurality of second trenches each extending from the other main surface towards the one main surface beyond said third layer and each having a second width narrower than the first width so as to divide each of said groups of said third layer into a plurality of segments, and fourth layers of one conductivity type each having an impurity concentration higher than that of said second layer, each of said fourth layers being exposed to a bottom of each of said first and second trenches and adjacent to said second layer;
   a plurality of silicide layers of a high melting point metal respectively formed over surfaces of bottoms of said first and second trenches in a self-aligned manner by side walls of said first and second trenches;
   a plurality of control electrodes respectively formed on said silicide layers which are formed on said plurality of first trenches so that each of said groups of said third layer is surrounded by corresponding ones of said control electrodes;

one main electrode in ohmic contact with said first layer at said one main surface of said semiconductor substrate body; and another main electrode in ohmic contact with individual segments of said third layer at the other main surface of said semiconductor substrate body.

4. A power conversion apparatus in which circuits each having therein at least one pair of turn off type semiconductor devices connected in series between dc terminals are connected in parallel with each other by an integral multiple of the number of phases of an ac side, and each of ac terminals is extended from each of middle points of said circuits connected in series, each of said turn off type semiconductor devices comprising:

a semiconductor substrate body including therein a pair of main surfaces, further having therein a first layer of one conductivity type adjacent to one of the main surfaces, a second layer of the other conductivity type adjacent to said first layer and having an impurity concentration lower than that of said first layer, a third layer of one conductivity type adjacent to said second layer, and a fourth layer of the other conductivity type adjacent to both said third layer and the other of the main surfaces and having an impurity concentration higher than that of said third layer, said fourth layer being divided into a plurality of groups by a plurality of first trenches each reaching said third layer and each having a first width, each of said groups being divided into a plurality of segments by a plurality of second trenches each reaching said third layer and each having a second width narrower than said first width;

a plurality of silicide layers of a high melting point metal respectively formed over surfaces of bottoms of said first and second trenches in a self-aligned manner by side walls of said first and second trenches;

a plurality of control electrodes respectively formed on said silicide layers which are formed on said plurality of first trenches so that each of said groups of said fourth layer is surrounded by corresponding ones of said control electrodes;

one main electrode in ohmic contact with said first layer at said one main surface of said semiconductor substrate body; and another main electrode in ohmic contact with individual segments of said fourth layer at the other main surface of said semiconductor substrate body.

5. A power conversion apparatus in which circuits each having therein at least one pair of turn off type semiconductor devices connected in series between dc terminals are connected in parallel with each other by the number or phases of an ac side, and each of ac terminals is extended from each of middle points of said circuits connected in series, each of said turn off type semiconductor devices comprising:

a semiconductor substrate body including therein a pair of main surfaces and further having therein a first layer of one conductivity type adjacent to one of the main surfaces, a second layer of the other conductivity type adjacent to said first layer and having an impurity concentration lower than that of said first layer, a third layer of the other conductivity type adjacent to both said second layer and the other of the main surfaces and having an impurity concentration higher than that of said second layer, a plurality of first trenches each extending from the other main surface towards the one main surface beyond said third layer and each having a first width so as to divide said third layer into a plurality of groups, a plurality of second trenches each extending from the other main surface towards the one main surface beyond said third layer and each having a second width narrower than the first width so as to divide each of said groups into a plurality of segments, and fourth layers of one conductivity type each having an impurity concentration higher than that of said second layer, each of said fourth layers being exposed to a bottom of each of said first and second trenches and adjacent to said second layer;

a plurality of silicide layers of a high melting point metal respectively formed over surfaces of bottoms of said first and second trenches in a self-aligned manner by side walls of said first and second trenches;

a plurality of control electrodes respectively formed on said silicide layers which are formed on said plurality of first trenches so that each of said groups of said third layer is surrounded by corresponding ones of said control electrodes;

one main electrode in ohmic contact with said first layer in one main surface of said semiconductor substrate body; and another main electrode in ohmic contact with individual segments of said third layer at the other main surface of said semiconductor substrate body.

6. A turn off type semiconductor device comprising:

a semiconductor substrate body including therein a pair of main surfaces, further having therein a first layer of one conductivity type adjacent to one of the main surfaces, a second layer of the other conductivity type adjacent to said first layer and having an impurity concentration lower than that of said first layer, a third layer of one conductivity type adjacent to said second layer, and a fourth layer of the other conductivity type adjacent to both said third layer and the other of the main surfaces and having an impurity concentration higher than that of said third layer, said fourth layer being divided into a plurality of groups by a plurality of first trenches each reaching said third layer and each having a first width, each of said groups being divided into a plurality of segments by a plurality of second trenches each reaching said third layer and each having a second width narrower than said first width;

a plurality of insulating films respectively formed on side surfaces of said first and second trenches of said semiconductor substrate body;

a plurality of silicide layers of a high melting point metal respectively formed over surfaces of bottoms of said first and second trenches in a self-aligned manner by side walls of said first and second trenches;

a plurality of control electrodes respectively formed on said which are formed said silicide layers which are formed on said plurality of first trenches so that each of said groups of said fourth layer is surrounded by corresponding ones of said control electrodes;

one main electrode in ohmic contact with said first layer at said one main surface of said semiconductor substrate body; and another main electrode in ohmic contact with individual segments of said fourth layer at the other main surface of said semiconductor substrate body.

7. A turn off type semiconductor device according to claim 1, wherein the silicide layers are formed over the whole surfaces of the bottoms of the first and second trenches.

8. A turn off type semiconductor device according to claim 2, wherein the silicide layers are formed over the whole surfaces of the bottoms of the first and second trenches.

9. A turn off type semiconductor device according to claim 3, wherein the silicide layers are formed over the whole surfaces of the bottoms of the first and second trenches.

10. A power conversion apparatus according to claim 4, wherein the silicide layers are formed over the whole surfaces of the bottoms of the first and second trenches.

11. A power conversion apparatus according to claim 5, wherein the silicide layers are formed over the whole surfaces of the bottoms of the first and second trenches.

12. A power conversion apparatus according to claim 6, wherein the silicide layers are formed over the whole surfaces of the bottoms of the first and second trenches.

13. A turn off type semiconductor device according to claim 1, wherein a portion of said p-type base layer in contact with said gate electrodes is a high impurity concentrated region.

14. A turn off type semiconductor device according to claim 1, wherein said insulator is an inorganic insulator.

15. A turn off type semiconductor device according to claim 2, wherein a high impurity concentrated region is formed in a portion of said third layer in contact with said control electrodes.

16. A turn off type semiconductor device according to claim 2, wherein an insulator is filled in each of said second trenches within an area surrounded by said control electrodes, and said another main electrode extends over the individual insulators.

17. A turn off type semiconductor device according to claim 16, wherein said insulator is an inorganic insulator.

18. A turn off type semiconductor device according to claim 2, wherein each of selected portions of said second layer is in ohmic contact with said one main electrode through a fifth layer of the other conductivity type having an impurity concentration higher than that of said second layer.

19. A turn off type semiconductor device according to claim 3, wherein an insulator is filled in each of said second trenches within an area surrounded by said control electrodes, and said another main electrode extends over the individual insulators.

20. A turn off type semiconductor device according to claim 3, wherein said insulator is an inorganic insulator.

21. A turn off type semiconductor device according to claim 3, wherein each of selected portions of said second layer is in ohmic contact with said one main electrode through a fifth layer of the other conductivity type having an impurity concentration higher than that of said second layer.

* * * * *